United States Patent
Toth et al.

(10) Patent No.: US 7,164,139 B1
(45) Date of Patent: Jan. 16, 2007

(54) WIEN FILTER WITH REDUCED CHROMATIC ABERRATION

(75) Inventors: Gabor D. Toth, San Jose, CA (US); Douglas K. Masnaghetti, San Jose, CA (US); Jeffrey Keister, Selden, NY (US); Eric Munro, London (GB)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/048,378

(22) Filed: Feb. 1, 2005

(51) Int. Cl.
*H01J 1/50* (2006.01)
(52) U.S. Cl. .............................. 250/396 ML; 250/298; 250/492.3
(58) Field of Classification Search .................... None
See application file for complete search history.

(56) References Cited

U.S. PATENT DOCUMENTS

| | | | |
|---|---|---|---|
| 4,019,989 A | 4/1977 | Hazewindus et al. | |
| 4,789,787 A | 12/1988 | Parker | |
| 5,444,243 A | 8/1995 | Kohhashi et al. | |
| 6,452,169 B1 | 9/2002 | Mook | |
| 6,509,569 B1 * | 1/2003 | Frosien | 250/396 R |
| 6,580,073 B1 * | 6/2003 | Plies et al. | 250/305 |
| 6,593,578 B1 | 7/2003 | Duval et al. | |
| 6,614,026 B1 * | 9/2003 | Adamec | 250/398 |
| 6,717,141 B1 | 4/2004 | Rouse et al. | |
| 6,787,772 B1 * | 9/2004 | Ose et al. | 250/310 |
| 6,885,001 B1 * | 4/2005 | Ose et al. | 250/310 |
| 2002/0011565 A1 * | 1/2002 | Drexel et al. | 250/310 |
| 2002/0028399 A1 * | 3/2002 | Nakasuji et al. | 430/30 |
| 2004/0004192 A1 * | 1/2004 | Krivanek et al. | 250/396 R |
| 2005/0045821 A1 * | 3/2005 | Noji et al. | 250/311 |

FOREIGN PATENT DOCUMENTS

| | | | |
|---|---|---|---|
| JP | 09-274880 | * | 10/1997 |
| JP | 2003-007238 | * | 1/2003 |
| JP | 2004-227888 | * | 8/2004 |

* cited by examiner

*Primary Examiner*—Nikita Wells
*Assistant Examiner*—Anthony Quash
(74) *Attorney, Agent, or Firm*—Okamoto & Benedicto LLP

(57) ABSTRACT

One embodiment disclosed relates to a Wien filter for a charged-particle beam apparatus. The charged-particle beam is transmitted through the Wien filter in a first direction. A magnetic field generation mechanism is configured to generate a magnetic field in a second direction which is perpendicular to the first direction, and an electrostatic field generation mechanism is configured to generate an electrostatic field in a third direction which is perpendicular to the first and second directions. The field generation mechanisms are further configured so as to have an offset between the positions of the magnetic and electrostatic fields along the first direction. Another embodiment disclosed relates to a Wien filter type device wherein the magnetic force is approximately twice in strength compared to the electrostatic force. Other embodiments are also disclosed.

12 Claims, 8 Drawing Sheets

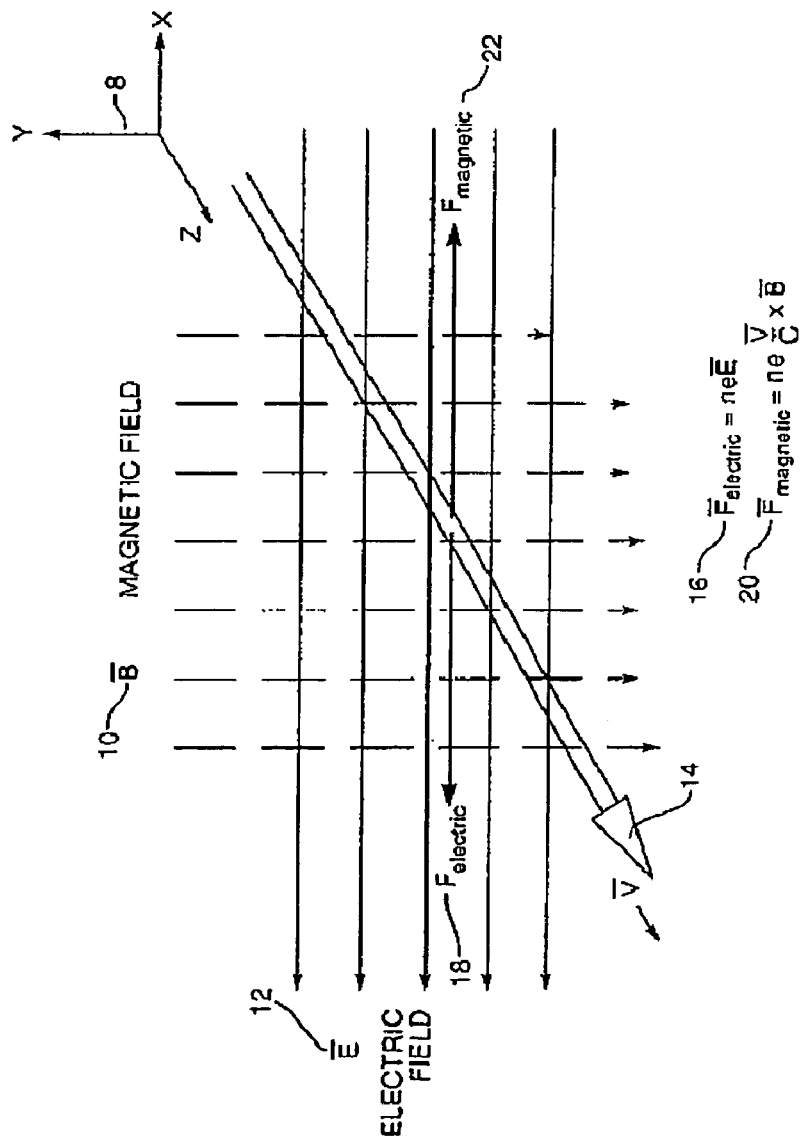
FIG. 1
(Conventional)

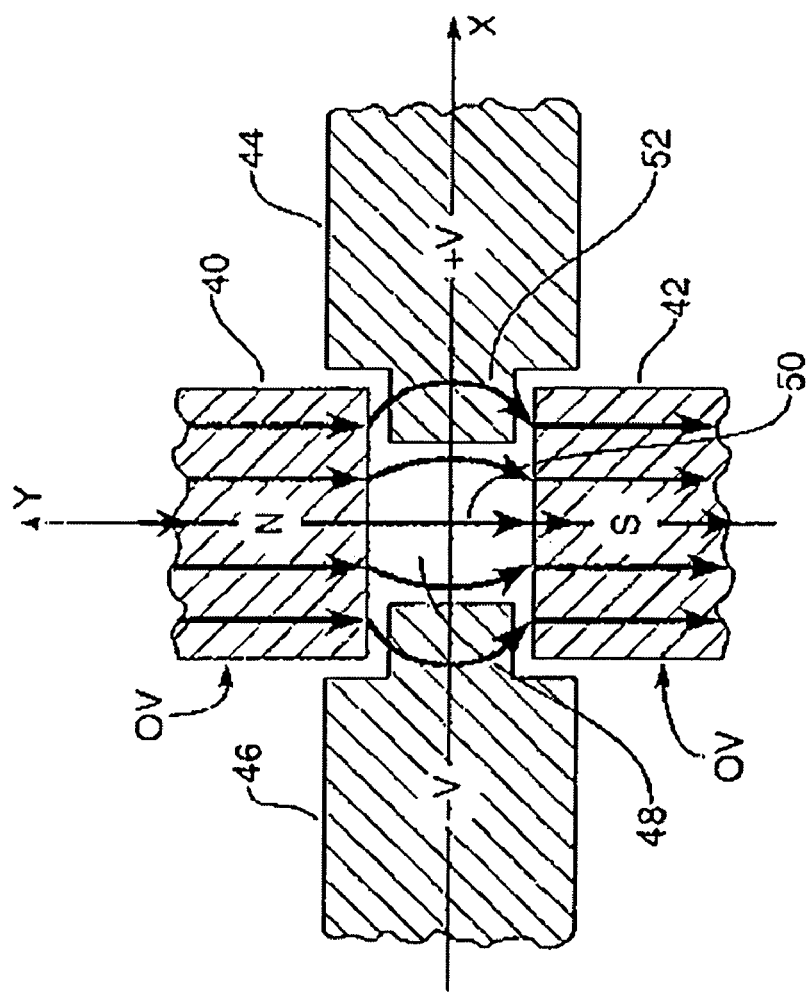
FIG. 2A
(Conventional)

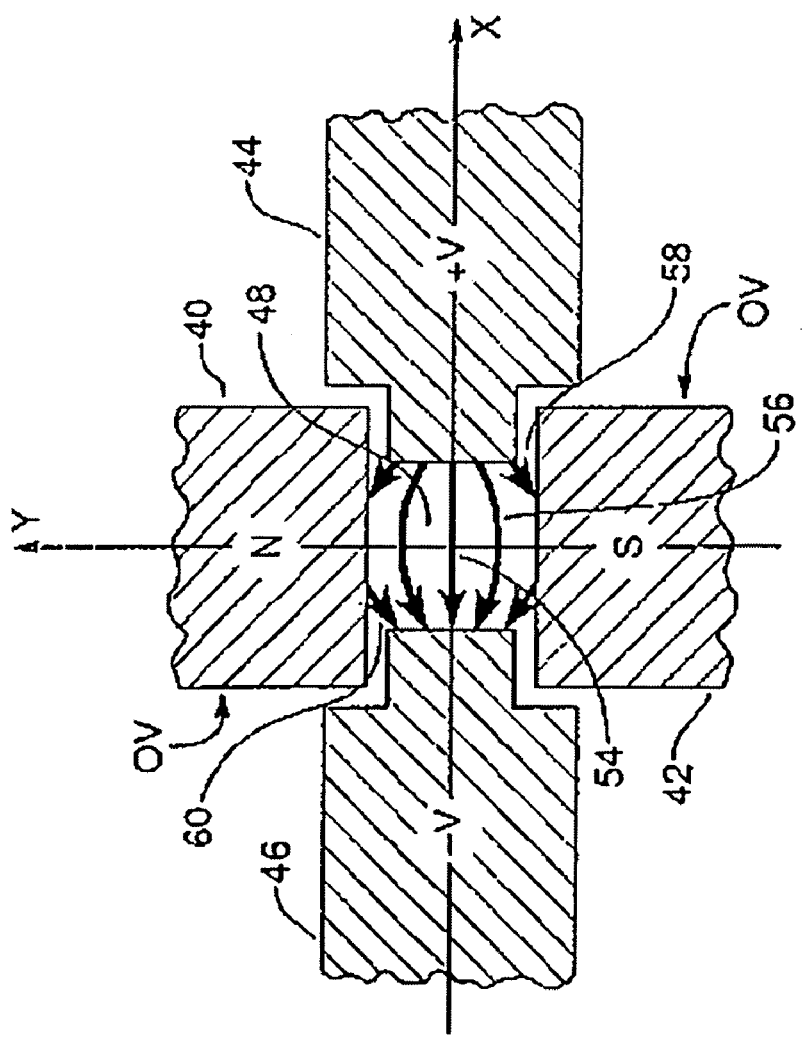
FIG. 2B (Conventional)

| Relative Strength of Current in Coil 1 $RS_1$ | Relative Strength of Current in Coil 2 $RS_2$ | Transverse Chromatic Ab. Coefficient of the Wien Filter $\|C_{TW}\|$ | Chromatic Dispersion at Target Plane $\delta r_i$ (nm) |
|---|---|---|---|
| 1.0 | 0.0 | 0.20810 | 34.89 |
| 0.0 | 1.0 | 0.25867 | 43.36 |
| 0.556 | 0.444 | 0.00033 | 0.06 |

FIG. 3B

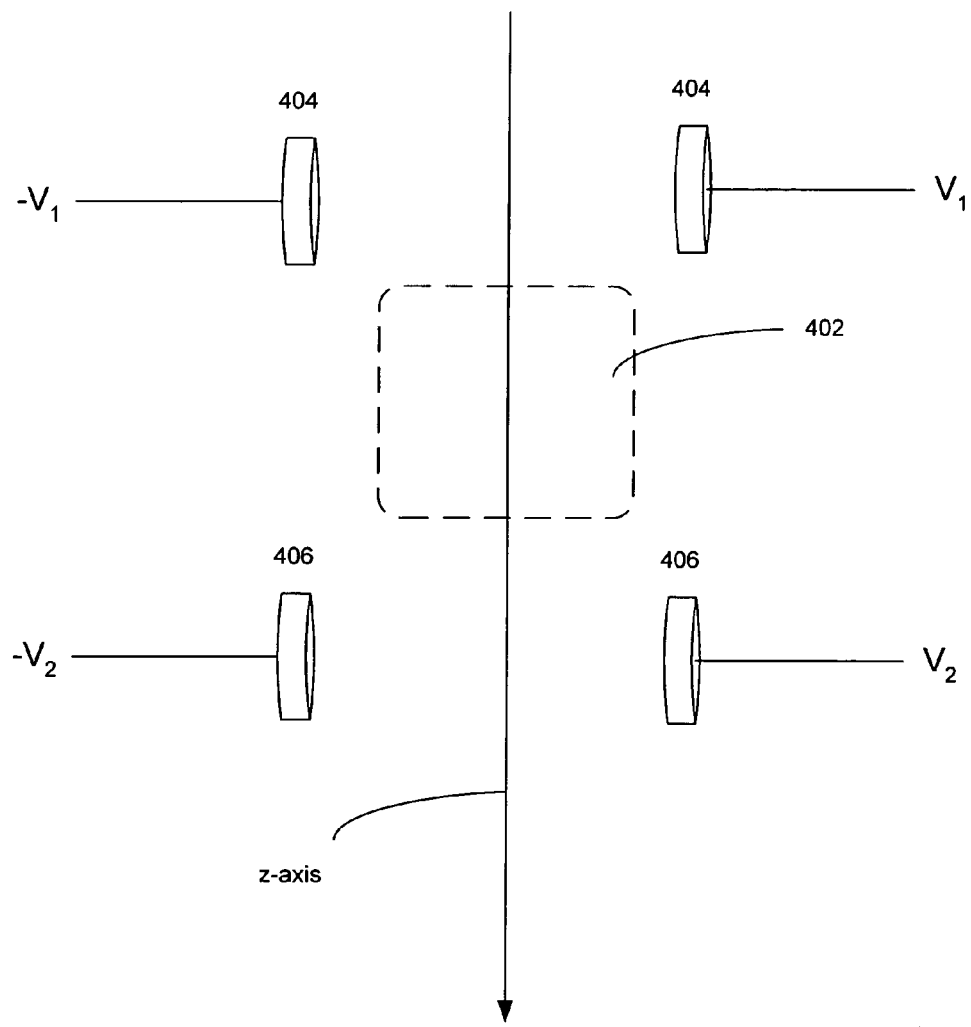
FIG. 4    400

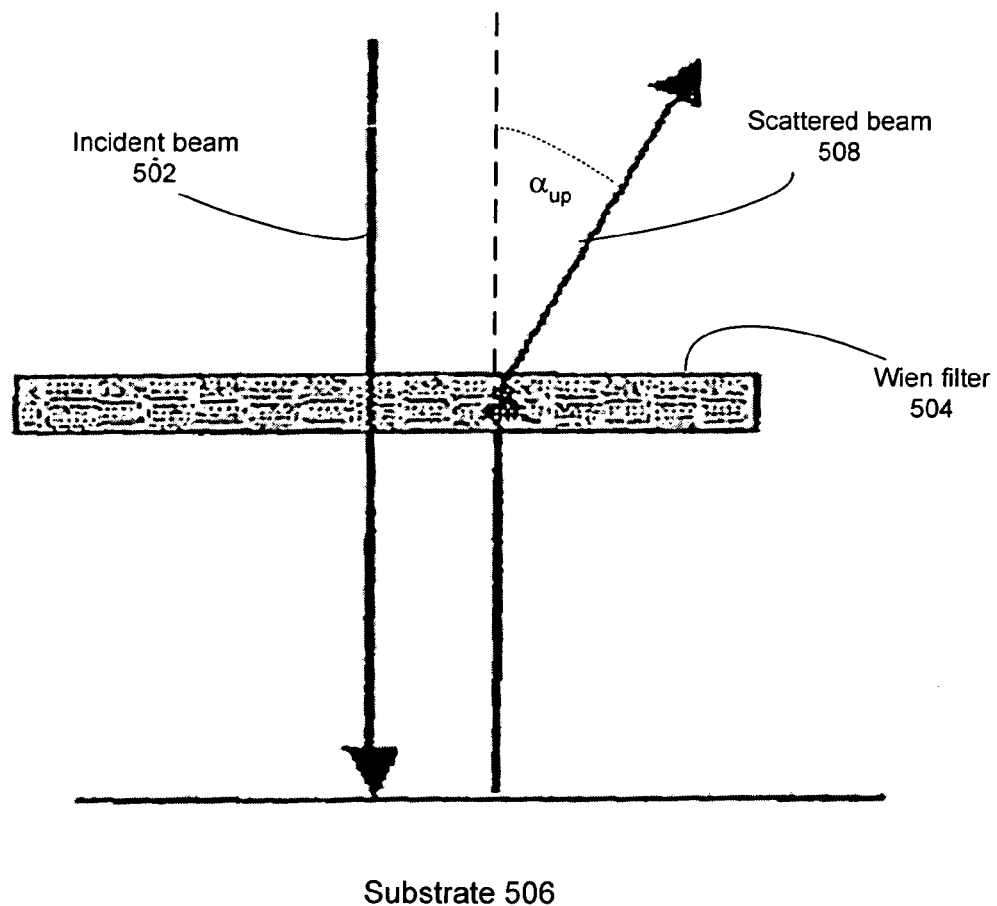
FIG. 5
(Conventional)

WIEN FILTER WITH REDUCED CHROMATIC ABERRATION

BACKGROUND OF THE INVENTION

1. Field of the Invention

The present invention relates generally to Wien filters, such as those used in charged-particle beam systems and for other purposes.

2. Description of the Background Art

FIG. 1 illustrates the operating principle of the Wien filter. This type of velocity (momentum) filter uses crossed electric and magnetic fields to exert opposing forces on charged particles passing through the filter. An X-Y-Z orthogonal coordinate system 8 is shown.

A substantially homogeneous magnetic field 10 of magnitude B is directed parallel to the Y-axis in the negative direction. A substantially homogeneous electric field 12 of magnitude E is directed parallel to the X-axis, also in the negative direction. A beam of charged particles 14 is directed initially (before encountering the fields 10 and 12) parallel to the Z-axis in the positive direction, and through the electric and magnetic fields. The fields 10 and 12 are positioned in space such that along trajectory 14, the magnitudes of fields 10 and 12 are always in the same proportion, rising from initial values of zero Gauss (G) and zero Volts/centimeter (V/cm) to some well-defined maximum values, then decreasing back to zero G and zero V/cm again.

Fields 10 and 12 apply forces to the beam of particles 14. The first Equation 16 expresses the force on beam 14 due to electric field 12. This electric force is in the −X direction for positive (+) particles as shown by force vector 18 in FIG. 1. The second Equation 20 expresses the force on beam 14 due to magnetic field 10. This magnetic force is proportional to the vector cross-product of the velocity v of each charged particle in beam 14 and the strength, B, of magnetic field 10. In this case, this magnetic force is in the +X direction for positively-charged particles as shown by force vector 22 in FIG. 1.

A conventional Wien filter is configured such that the force vectors 18 and 22 are equal in magnitude. As such, the electric and magnetic forces 18 and 22 will cancel each other for a charged particle traveling in one direction along the z-axis, while the electric and magnetic forces 18 and 22 will add together to a larger force (double the individual forces) for the same charged particle traveling in the opposite direction along the z-axis. This is due to the fact that the direction of the magnetic force 22 depends on the direction of the velocity vector 14 of the particle, while the direction of the electric force 18 is independent of the velocity vector 14. For example, consider the specific case where the charged particles are electrons. The electric and magnetic forces will cancel each other for electrons going in the negative z direction, while the electric and magnetic forces will add together for electrons going in the positive z direction.

FIGS. 2A and 2B show a typical design for the magnetic field pole pieces 40 and 42, and electric field pole pieces 44 and 46, of a conventional Wien filter. In FIG. 2A, the magnetic field lines are shown as they extend through the magnetic material of pole pieces 40 and 42 (both at zero volts) and between them in the space 48, through which beam 14 passes. FIG. 2B shows the electric field lines which result when voltages +V and −V are applied to electric pole pieces 44 and 46, respectively.

As pointed out in the present disclosure, one disadvantageous aspect of a conventional Wien filter is the chromatic aberration that is induced. Charged particles in a beam of different speeds are deflected to different angles by a conventional Wien filter. In other words, the change in trajectory caused by a conventional Wien filter depends on the energy of the charged particle.

It is desirable to improve charged-particle beam apparatus. It is also desirable to improve Wien filters. In particular, it is desirable to reduce the chromatic aberration caused by Wien filters.

BRIEF DESCRIPTION OF THE DRAWINGS

FIG. 1 is diagram of the operating principle of a conventional Wien filter.

FIGS. 2A and 2B are cross-sectional diagrams of a typical conventional Wien filter, showing magnetic and electric fields, respectively.

FIG. 3B provides a table showing chromatic dispersion as a function of the relative strengths of the two magnetic deflection coils in an example apparatus in accordance with en embodiment of the present invention.

FIG. 4 is a schematic diagram depicting a second configuration for a Wien filter in accordance with another embodiment of the invention.

FIG. 5 is a schematic diagram of a charged-particle apparatus with a conventional Wien filter configuration.

SUMMARY

One embodiment of the invention pertains to a Wien filter for a charged-particle beam apparatus. The charged-particle beam is transmitted through the Wien filter in a first direction. A magnetic field generation mechanism is configured to generate a magnetic field in a second direction which is perpendicular to the first direction, and an electrostatic field generation mechanism is configured to generate an electrostatic field in a third direction which is perpendicular to the first and second directions. The field generation mechanisms are further configured so as to have an offset between the positions of the magnetic and electrostatic fields along the first direction. Advantageously, the offset between the positions of the magnetic and electrostatic fields along the first direction may be configured such that a chromatic dispersion at a target plane is minimized Another embodiment disclosed relates to a Wien filter type device wherein the magnetic force is approximately twice in strength compared to the electrostatic force. The device may be configured to deflect an incident beam of charged particles towards a target substrate and to deflect a scattered beam from the substrate to a detector. Advantageously, the device may be configured to reduce or eliminate the chromatic aberration caused by the device.

Other embodiments are also discussed.

DETAILED DESCRIPTION

Figure 3A:
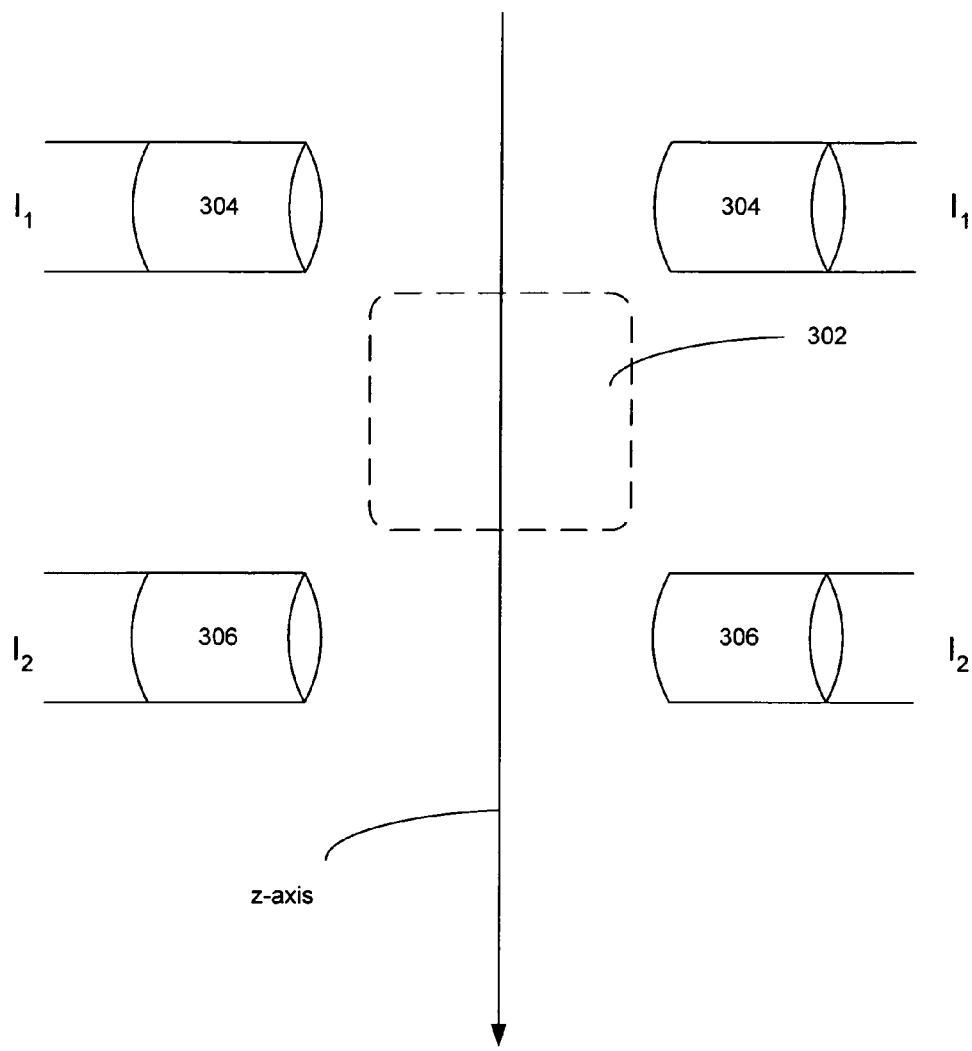
FIG. 3A is a schematic diagram depicting a first configuration for a Wien filter in accordance with an embodiment of the invention.

FIG. 3A is a schematic diagram depicting a first configuration 300 for a Wien filter in accordance with an embodiment of the invention. In this embodiment, the first-order chromatic aberration may be reduced or eliminated by offsetting the effective position of the magnetic field with respect to the electrostatic field.

In FIG. 3A, the z-axis is shown as going downwards within the page. The trajectory of the charged particles entering the Wien filter is along the z-axis. The Wien filter configuration 300 is such that the electrostatic field is perpendicular to the plane of the page in the approximate area 302 indicated near the center of FIG. 3A.

Unlike the conventional Wien filter, the Wien filter configuration 300 of FIG. 3A includes two pairs of magnetic deflection coils 304 and 306, each pair of coils being offset relative to the average z-position of the electrostatic field 302. One pair of coils 304 is offset in a negative z-direction relative to the average position of the electrostatic field 302, and the other pair of coils 306 is offset in a positive z-direction relative to the average position of the electrostatic field 302. Each pair of coils is configured so as to generate a magnetic field in a direction perpendicular to the electrostatic field and perpendicular to the z-axis. As in the conventional Wien filter, the ratio of the electrostatic field strength (E) to the magnetic field strength (B) is equal to, or approximately equal to, the speed (v) of the charged particles. In other words, E/B=v.

By adjusting the electric current running through one pair of coils relative to the current running through the other pair of coils, the z-position offset of the total effective magnetic field may be controllably changed. The specific currents to run in each pair of coils may be determined so as to minimize the chromatic aberration for the specific implementation.

FIG. 3B includes a table showing chromatic dispersion as a function of the relative strengths of the two pairs of magnetic deflection coils in an example apparatus in accordance with en embodiment of the present invention. The first two columns give the relative strengths ($RS_1$ and $RS_2$) of the two pairs of coils (named Coil 1 and Coil 2). The third column shows the transverse chromatic aberration coefficient for the Wien filter ($|C_{TW}|$). The fourth column shows the resultant first-order chromatic dispersion at the target plane ($\delta r_1$) in nanometers. As shown in the table, the transverse chromatic aberration coefficient and the first-order chromatic dispersion at the target plane are dramatically reduced (by a factor of more than a hundred) to a negligible amount when the relative strengths of coils 1 and 2 are 0.556 and 0.444, respectively.

FIG. 4 is a schematic diagram depicting a second configuration for a Wien filter in accordance with an embodiment of the invention. Similar to the embodiment discussed in relation to FIG. 3A, the embodiment of FIG. 4 provides for the reduction or elimination of the first-order chromatic aberration. In the embodiment of FIG. 4, this is accomplished by offsetting the effective position of the electrostatic field with respect to the magnetic field.

In FIG. 4, the z-axis is shown as going downwards within the page. The trajectory of the charged particles entering the Wien filter is along the z-axis. The Wien filter configuration 400 is such that the magnetic field is perpendicular to the plane of the page in the approximate area 402 indicated near the center of FIG. 4.

Unlike the conventional Wien filter, the Wien filter configuration 400 of FIG. 4 includes two pairs of electrostatic deflection plates 404 and 406, each pair of plates being offset relative to the average z-position of the magnetic field 402. One pair of plates 404 is offset in a negative z-direction relative to the average position of the magnetic field 402, and the other pair of plates 406 is offset in a positive z-direction relative to the average position of the magnetic field 402. Voltages are applied across each pair of plates so as to generate an electrostatic field in a direction perpendicular to the magnetic field and perpendicular to the z-axis.

By adjusting the voltage difference applied to one plate relative to the voltage difference applied to the other plate, the z-position offset of the total effective electrostatic field may be controllably changed. The specific voltage differences to be applied may be determined so as to minimize the chromatic aberration for the specific implementation.

In other embodiments, other configurations may be used to offset the electrostatic and magnetic fields relative to each other so as to achieve the desired reduction in chromatic aberration. For example, while the embodiment of FIGS. 3A is advantageously easy to adjust electronically, an alternate embodiment may utilize two pairs of pole pieces to generate the magnetic field, rather than two pairs of coils. As another example, a single pair of pole pieces (or coils) may be used, and the offset between magnetic and electrostatic fields may be accomplished by mechanical positioning so as to offset the pole pieces (or coils) from the electrostatic plates. Other embodiments may utilize various alternate ways to achieve the offset between magnetic and electrostatic fields.

FIG. 5 is a schematic diagram of a charged-particle apparatus 500 with a conventional Wien filter configuration. This is a typical arrangement of a Wien filter 504 as used in an electron microscope or similar charged-particle beam apparatus. In this conventional arrangement, the Wien filter 504 is configured with an E/B ratio of v/c, where E is the magnitude of the electrostatic field strength, B is the magnitude of the magnetic field strength, v is the speed of the incident charged particles.

The incident beam 502 of charged particles is directed at a perpendicular angle towards the target substrate 506, and the incident beam 502 passes through the Wien filter 504, typically un-deflected, on its way to impinging upon the substrate 506. Due to the interaction between the incident beam 502 and the substrate 506, a scattered beam 508 of charged particles is generated and travels back through the Wien filter 504. In this case, since the velocity of the scattered beam 508 is opposite in direction to the velocity of the incident beam 502, the scattered beam 508 does not pass un-deflected through the Wien filter 504. Instead, the Wien filter 504 deflects the scattered beam by an angle $\alpha_{up}$. By such deflection, the scattered beam 508 is separated from the incident beam 502, such that the scattered beam 508 may travel to a detector.

Results have been determined for an apparatus 500 with a conventional Wien filter configuration as in FIG. 5. These results assumed an electric field strength E=220 volts/cm, and a magnetic field strength B=EG/v=5.25 gauss. It is calculated that the deflection angle for the scattered beam $\alpha_{up}$=5.80 degrees. The calculated chromatic spread for a typical TFE electron source is $\Delta\alpha = 8.7 \times 10^{-5}$ degrees, which is significant.

Figure 6:
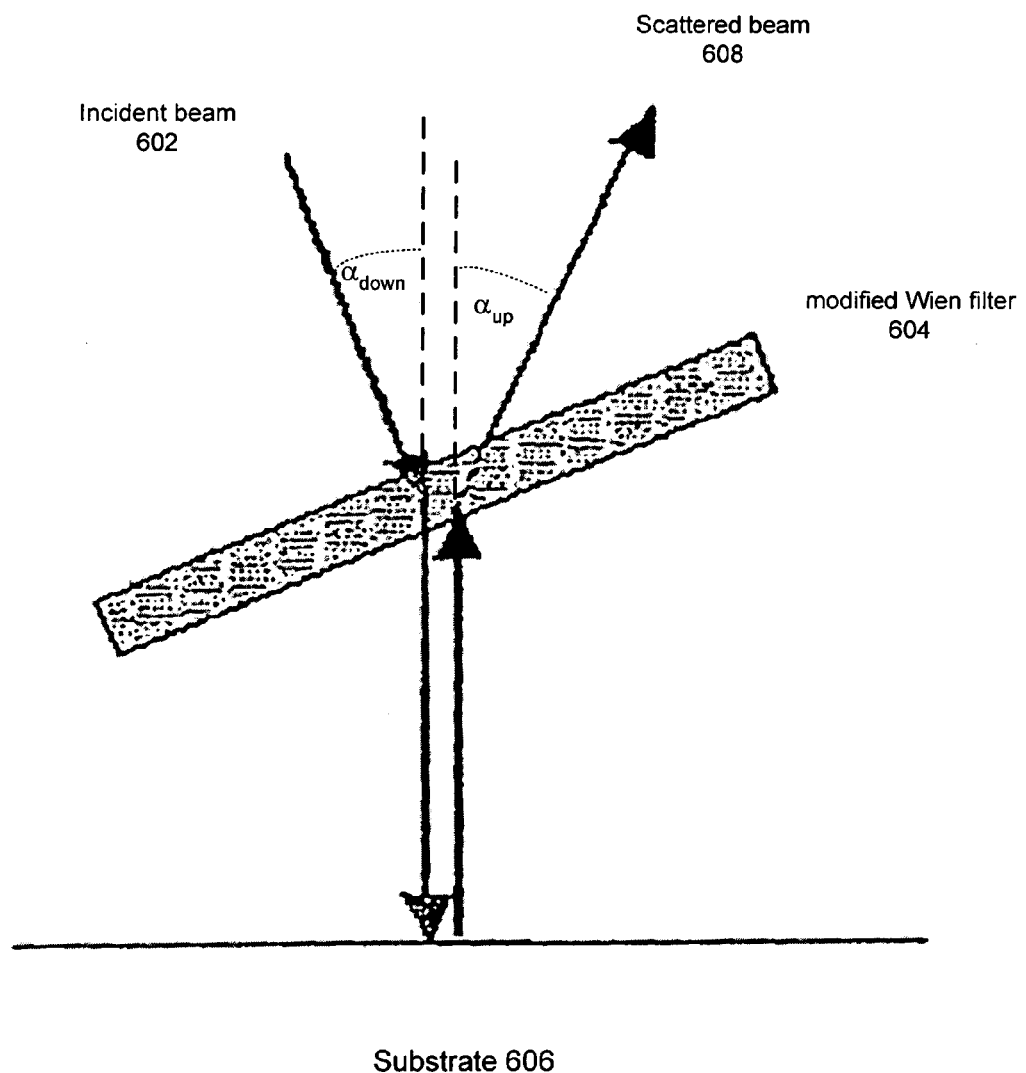
FIG. 6 schematic diagram of a charged-particle apparatus with a Wien filter configuration in accordance with an embodiment of the invention.

FIG. 6 schematic diagram of a charged-particle apparatus 600 with a modified Wien filter configuration in accordance with an embodiment of the invention. This arrangement of a modified Wien filter 604 may be called an "achromatic" arrangement and may be used in an electron microscope or similar charged-particle beam apparatus. Here, the modified Wien filter 604 is configured such that the electrostatic field is only one half the strength of the electrostatic field in the conventionally-configured Wien filter 604. In other words, the modified Wien filter 604 is configured with an E/B ratio of v/2.

Here, the incident beam 602 of charged particles is directed at a non-perpendicular angle $\alpha_{down}$ towards the target substrate 606. The incident beam 602 enters the modified Wien filter 604 and is deflected such that the beam 602 may impinge at a perpendicular angle upon the substrate 606. Due to the interaction between the incident beam 602 and the substrate 606, the scattered beam 608 of charged particles is generated and travels back through the modified Wien filter 604. In this case, the modified Wien filter 604 deflects the scattered beam by an angle $\alpha_{up}$. By such deflection, the scattered beam 608 is separated from the incident beam 602, such that the scattered beam 608 may travel to a detector.

Results have been determined for an apparatus 600 with the Wien filter configuration discussed above in relation to FIG. 6 in accordance with an embodiment of the invention. These results assumed an electric field strength E=220 volts/cm, and a magnetic field strength B=2E/v=10.49 gauss. It was calculated that the deflection angle for the primary beam is $\alpha_{down}$=2.90 degrees, and that the deflection angle for the scattered beam $\alpha_{up}$=8.70 degrees, such that the beam separation=$\alpha_{down}-\alpha_{up}$=11.60 degrees. Advantageously, the calculated chromatic aberration $\Delta\alpha$=0 degrees. This is so because the B=2E/v condition eliminates the first order chromatic aberration of the Wien filter but leaves a non-zero net deflection of the beam. This net deflection can practically be accommodated by many different means. One is presented in FIG. 6 where the incoming beam 602 is mechanically positioned at an angle with respect to the final imaging elements of the system. In other manifestations it is possible to electronically correct (deflect or pre-deflect) the incoming beam to ensure the path along the optical axis of the remaining optical elements.

The above-described diagrams are not necessarily to scale and are intended be illustrative and not limiting to a particular implementation. The above-described invention may be used in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A Wien filter for a charged-particle beam apparatus, the Wien filter comprising:

an opening for transmission of the charged-particle beam through the Wien filter in a first direction;

a first field generation mechanism comprising a first set of devices configured to generate a first field in a second direction which is perpendicular to the first direction; and a second field generation mechanism comprising second and third sets of devices configured to generate a second field in a third direction which is perpendicular to the first and second directions, wherein one of said fields is a magnetic field and another of said fields is an electrostatic field, and wherein said fields are further configured such that a ratio of electrostatic field strength (E) to magnetic field strength (B) is approximately equal to a speed (v) of charged particles in the beam, and wherein the second and third sets of devices are located along the first direction before and after the first set of devices, and wherein the second and third sets of devices are configured to generate different field strengths relative to each other, such that a first-order chromatic dispersion at a target plane is minimized.

2. The Wien filter of claim 1, wherein each of said second and third sets of devices comprises a set of electrically-conductive coils, and wherein said different field strengths are controlled by adjusting electrical currents running through the coils.

3. The Wien filter of claim 2, wherein the electrical currents are adjusted so as to minimize a transverse chromatic aberration coefficient of the Wien filter.

4. The Wien filter of claim 1, wherein each of said second and third sets of devices comprises a set of pole pieces, and wherein the said different field strengths are determined by the locations and strengths of the pole pieces.

5. The Wien filter of claim 1, wherein each of said second and third sets of devices comprises a pair of electrically-conductive plates, and wherein said different field strengths are controlled by adjusting voltage levels applied to the plates.

6. The Wien filter of claim 5, wherein the voltage levels are adjusted so as to minimize a transverse chromatic aberration coefficient of the Wien filter.

7. A method of applying forces to charged particles using a modified Wien filter, the method comprising:

generating an incident beam of charged particles traveling in a first direction through the device;

using a first set of devices to generate a first field that applies a first force to the charged particles in a second direction which is perpendicular to the first direction;

using second and third sets of devices to generate a second field that applies a second force to the charged particles in an opposite direction to the second direction, wherein one of said forces is an electrostatic force and another of said fields is a magnetic force, and wherein the magnetic force is approximately equal in strength to the electrostatic force, wherein the first set of devices is located in between the second and third sets of devices along the first direction, and the second and third sets of devices are configured to generate different field strengths relative to each other, such that a first-order chromatic dispersion at a target plane is minimized.

8. The method of claim 7, wherein each of said second and third sets of devices comprises a set of electrically conductive coils, and wherein said different field strengths are controlled by adjusting electrical currents running through the coils.

9. The method of claim 8, further comprising adjusting the electrical currents so as to minimize a transverse chromatic aberration coefficient of the device.

10. The method of claim 7, wherein each of said second and third sets of devices comprises a set of pole pieces, and wherein said different field strengths are determined by the locations and strengths of the pole pieces.

11. The method of claim 7, wherein each of said second and third sets of devices comprises a set of electrically-conductive plates, and wherein said different field strengths are controlled by adjusting voltage levels applied to the plates.

12. The method of claim 11, wherein the voltage levels are adjusted so as to minimize a transverse chromatic aberration coefficient of the device.

* * * * *